United States Patent
Yeh

(10) Patent No.: US 9,214,531 B2
(45) Date of Patent: Dec. 15, 2015

(54) TRENCHED POWER MOSFET WITH ENHANCED BREAKDOWN VOLTAGE AND FABRICATION METHOD THEREOF

(71) Applicant: GREAT POWER SEMICONDUCTOR CORP., New Taipei (TW)

(72) Inventor: Chun-Ying Yeh, Hsinchu (TW)

(73) Assignee: GREAT POWER SEMICONDUCTOR CORP., New Taipei (TW)

( * ) Notice: Subject to any disclaimer, the term of this patent is extended or adjusted under 35 U.S.C. 154(b) by 171 days.

(21) Appl. No.: 13/788,087

(22) Filed: Mar. 7, 2013

(65) Prior Publication Data
US 2014/0120670 A1    May 1, 2014

Related U.S. Application Data

(62) Division of application No. 13/661,733, filed on Oct. 26, 2012.

(51) Int. Cl.
| | |
|---|---|
| H01L 21/336 | (2006.01) |
| H01L 29/66 | (2006.01) |
| H01L 29/423 | (2006.01) |
| H01L 29/78 | (2006.01) |

(52) U.S. Cl.
CPC ...... *H01L 29/66666* (2013.01); *H01L 29/4236* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 2001/0015457 A1* | 8/2001 | Boden, Jr. | 257/330 |
| 2002/0056871 A1* | 5/2002 | Kocon et al. | 257/328 |
| 2002/0115257 A1 | 8/2002 | Inagawa et al. | |
| 2008/0073707 A1* | 3/2008 | Darwish | 257/330 |
| 2009/0140327 A1* | 6/2009 | Hirao et al. | 257/328 |
| 2011/0006363 A1* | 1/2011 | Hsieh | 257/330 |
| 2012/0043602 A1* | 2/2012 | Zeng et al. | 257/330 |
| 2012/0319199 A1* | 12/2012 | Zeng et al. | 257/334 |

FOREIGN PATENT DOCUMENTS

| | | |
|---|---|---|
| CN | 101385147 A | 3/2009 |
| CN | 102201366 A | 9/2011 |

* cited by examiner

*Primary Examiner* — Evan Pert
*Assistant Examiner* — Shaka White
(74) *Attorney, Agent, or Firm* — Lia & Cai Intellectual Property (USA) Office

(57) ABSTRACT

A trenched power semiconductor device with enhanced breakdown voltage is provided. The trenched power semiconductor device has a first trench penetrating the body region located between two neighboring gate trenches. A polysilicon structure with a conductivity type identical to that of the body region is located in a lower portion of the first trench and spaced from the body region with a predetermined distance. A dielectric structure is located on the polysilicon structure and at least extended to the body region. Source regions are located in an upper portion of the body region. A heavily doped region located in the body region is extended to the bottom of the body region. A conductive structure is electrically connected to the heavily doped region and the source region.

16 Claims, 14 Drawing Sheets

US 9,214,531 B2

TRENCHED POWER MOSFET WITH ENHANCED BREAKDOWN VOLTAGE AND FABRICATION METHOD THEREOF

BACKGROUND

1. Technical Field

This invention relates to a trenched power semiconductor device and a fabrication method thereof, and more particularly relates to a trenched power semiconductor device with enhanced breakdown voltage and a fabrication method thereof.

2. Description of Related Art

In the technology trend for saving energy, on resistance of power semiconductor devices has become an important issue to be concerned. The improvement of on resistance is helpful for reducing conduction loss of application circuit but always attended with decreasing of breakdown voltage. For example, the solutions for improving on resistance, such as adjusting doping concentration and thickness of epitaxial layers, may badly influence structural reliability of power semiconductor devices.

Accordingly, it is an important topic in the art to figure out a trenched power semiconductor device with enhanced breakdown voltage so as to improve structural reliability.

SUMMARY

It is a main object of the present invention to provide a trenched power semiconductor device with enhanced breakdown voltage and a fabrication method thereof. It is another object of the present invention to figure out a trenched power semiconductor device with the potential to provide a good balance between on-resistance and breakdown voltage.

For the above mentioned object, a trenched power semiconductor device with enhanced breakdown voltage is provided in accordance with an embodiment of the present invention. The trenched power semiconductor device comprises a substrate, at least two gate trenches, a first dielectric layer, a first polysilicon structure, at least a first trench, a body region of a first conductive type, a second polysilicon structure of the first conductive type, a source region of a second conductive type, at least a heavily doped region of the first conductive type, and a source metal layer. The gate trenches are located in the substrate. The first dielectric layer covers inner surfaces of the gate trenches. The first polysilicon structure is located in the gate trenches. The first trench is located between the neighboring gate trenches. The body region is located between the gate trenches. The first trench penetrates the body region to the substrate below the body region. The second polysilicon structure is located in a lower portion of the first trench and spaced from the body region located above the second polysilicon structure with a predetermined distance. The source region is located in an upper portion of the body region. The heavily doped region is located in the body region. The source metal layer is electrically connected to the heavily doped region and the source region.

A fabrication method of the trenched power semiconductor device is also provided in the present invention. In accordance with an embodiment of the present invention, the fabrication method comprises at least the steps of: (a) providing a substrate; (b) forming at least two gate trenches in the substrate; (c) forming a first dielectric layer lining inner surfaces of the gate trenches; (d) forming a first polysilicon structure in the gate trenches; (e) forming at least a first trench between the neighboring gate trenches; (f) forming a second polysilicon structure of a first conductive type in a lower portion of the first trench; (g) forming a body region of the first conductive type between the gate trenches, the first trench being extended to the substrate below the body region, and the second polysilicon structure being spaced from the body region located above the second polysilicon structure with a predetermined distance; (h) forming a source region of a second conductive type in an upper portion of the body region; (i) forming an interlayer dielectric layer on the first polysilicon structure to define a source contact window aligned to the first trench; (j) forming at least a heavily doped region of the first conductive type in the body region; and (k) filling a source metal layer in the source contact window for electrically connecting to the heavily doped region and the source region.

BRIEF DESCRIPTION OF THE DRAWINGS

The present invention will now be specified with reference to its preferred embodiment illustrated in the drawings, in which.

DESCRIPTION OF THE EXEMPLARY EMBODIMENTS

Figure 1A:
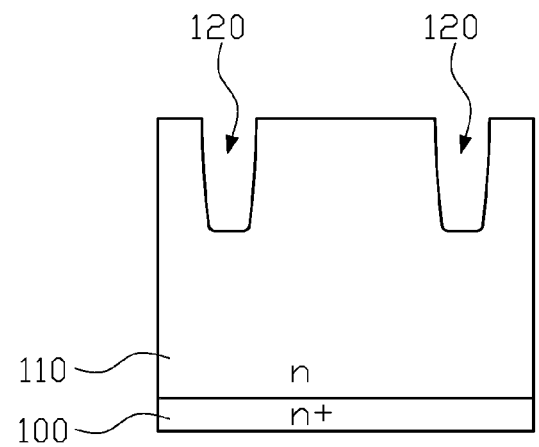
FIGS. 1A to 1H are schematic views showing a fabrication method of a trenched power semiconductor device with enhanced breakdown voltage in accordance with a first embodiment of the present invention.
Figure 1B:
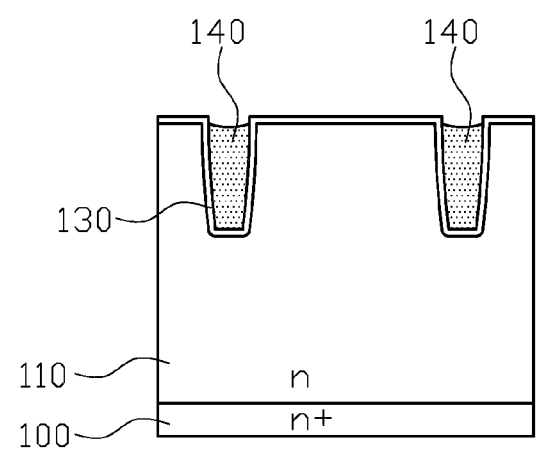

FIGS. 1A to 1H are schematic views showing a fabrication method of a trenched power semiconductor device with enhanced breakdown voltage in accordance with a first exemplary embodiment of the present invention and an n-type trenched power semiconductor device is described. However, the present invention is not so restricted. The technology provided in the present invention can be applied to the p-type power semiconductor device with no doubt. Referring to FIG. 1A, firstly, an n-type epitaxial layer 110 is formed on an n-type substrate 100 such that a base region for forming the trenched power semiconductor device is provided. Then, at least two gate trenches 120 are formed in the epitaxial layer 110. Thereafter, as shown in FIG. 1B, a first dielectric layer 130 is conformally formed on the epitaxial layer 110 to line the inner surfaces of the gate trenches 120. Then, a first polysilicon structure 140 is formed in the gate trenches 120 as the gate electrode of the trenched power semiconductor device.

Figure 1C:
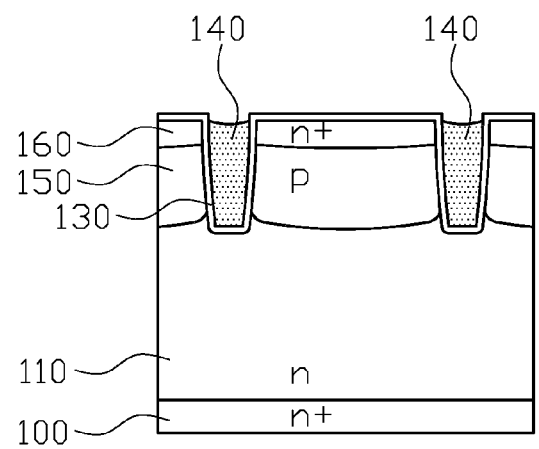
Figure 1D:
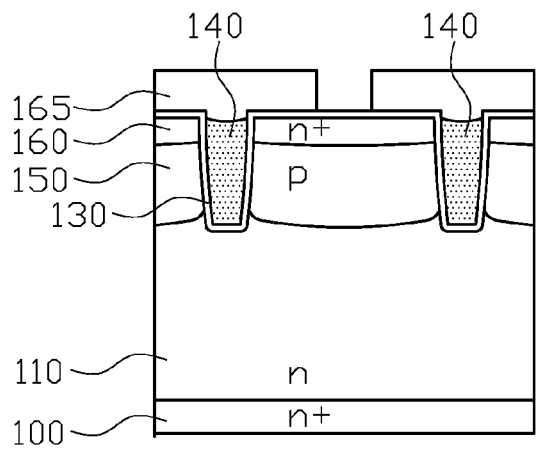
Figure 1E:
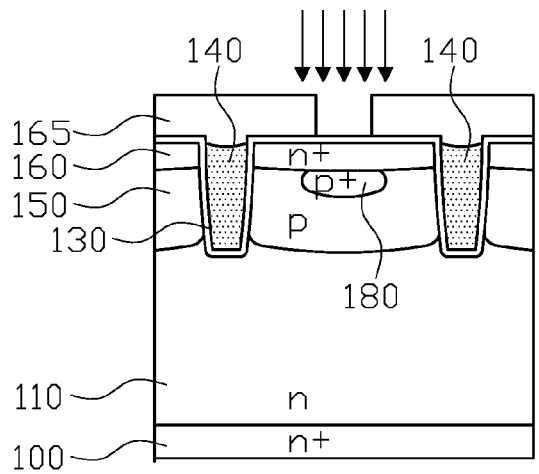

Afterward, as shown in FIG. 1C, an ion implantation step is carried out to form the p-type body region 150 in the epitaxial layer 110 surrounding the gate trenches 120. Then, another ion implantation step is used to form the n-type source region 160 in an upper portion of the body region 150. The source region 160 is adjacent to the gate trenches 120. Next, as shown in FIG. 1D, a pattern layer 165 is formed on the epitaxial layer 110 to define a first trench between the neighboring gate trenches 120 in the epitaxial layer 110. Thereafter, as shown in FIG. 1E, by using the pattern layer 165 as an implantation mask, an ion implantation step is carried out to form the p-type heavily doped region 180 below the source region 160. With the characteristics of ion implantation technology, the range of the heavily doped region 180 would be a little greater than the width of the open of the pattern layer 165.

Figure 1F:
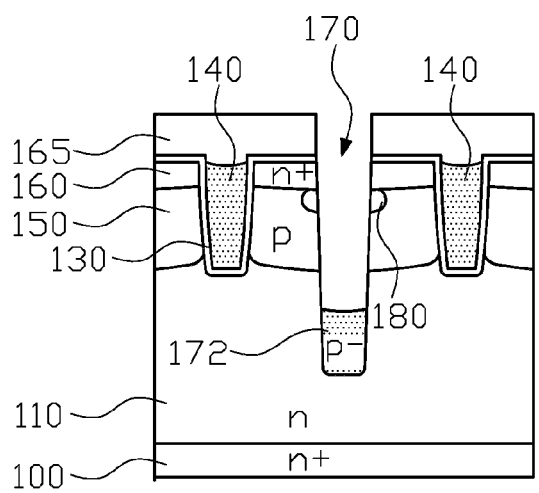

Then, as shown in FIG. 1F, by using the pattern layer 165 as an etching mask, the first trench 170 penetrating the body region 150 and dividing the source region 160 as well as the p-type heavily doped region 180 into two portions respectively is formed in the epitaxial layer 110. Thereafter, the p-type lightly doped second polysilicon structure 172 is formed in a lower portion of the first trench 170. The upper surface of the second polysilicon structure 172 is away from the lower surface of the body region 150 with a predetermined distance so as to prevent the contact of the second polysilicon structure 172 and the body region 150.

Figure 1G:
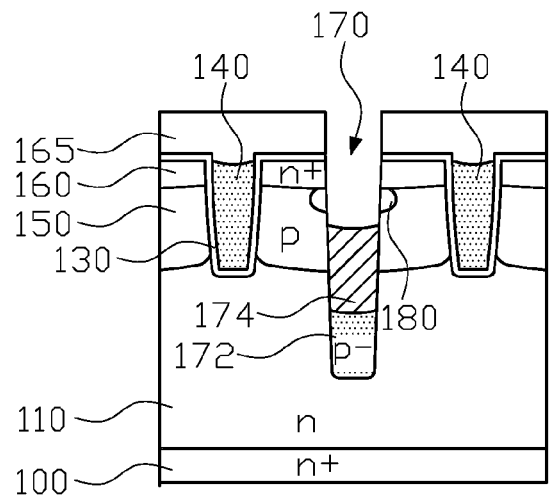
Figure 1H:
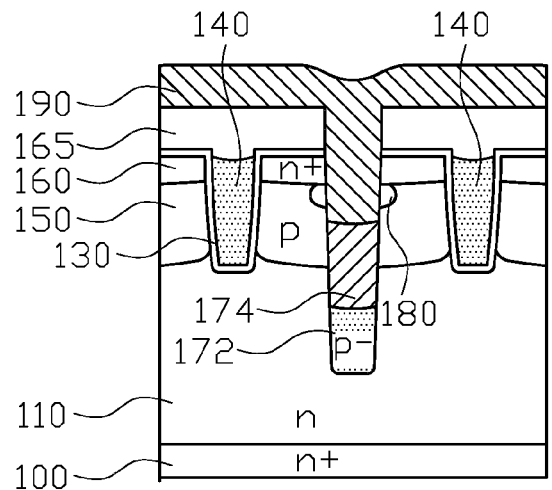

Then, as shown in FIG. 1G, a dielectric structure 174 is formed in the first trench 170. The dielectric structure 174 is located above the second polysilicon structure 172 and is extended from within the body region 150 downward to the epitaxial layer 110 below the body region 150. Then, as shown in FIG. 1H, a source metal layer 190 is formed on the pattern layer 165 and fills the first trench 170 to connect to the heavily doped region 180 and the source region 160.

The p-type second polysilicon structure 172 below the body region acts as a p-type floating area for improving electric field distribution between the bottom of the gate trench 120 and the drain electrode such that the breakdown voltage can be enhanced. With the enhancement provided by the p-type second polysilicon structure 172, implantation depth of the p-type heavily doped region 180 may be increased even to the bottom of the body region 150 with little concern about the problem of low breakdown voltage.

Figure 2:
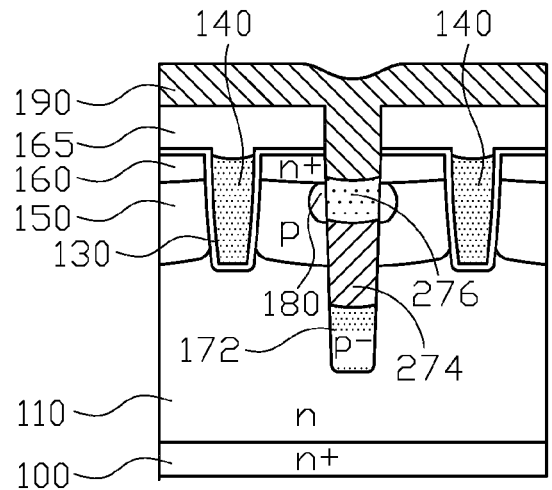
FIG. 2 is a schematic view showing a fabrication method of a trenched power semiconductor device with enhanced breakdown voltage in accordance with a second embodiment of the present invention.

FIG. 2 is a schematic view of a fabrication method of a trenched power semiconductor device with enhanced breakdown voltage in accordance with a second exemplary embodiment of the present invention. A major difference between the present embodiment and the first embodiment lies in the fabrication steps for forming the p-type heavily doped region 180. As shown, the p-type heavily doped region 180 below the source region 160 of the present embodiment is not formed by using the ion implantation step. In the present embodiment, a p-type heavily doped polysilicon structure 276 is firstly formed above the dielectric structure 274 and then a thermal diffusion step is carried out to form the p-type heavily doped region 180 adjacent to the side surface of the heavily doped polysilicon structure 276.

Figure 3A:
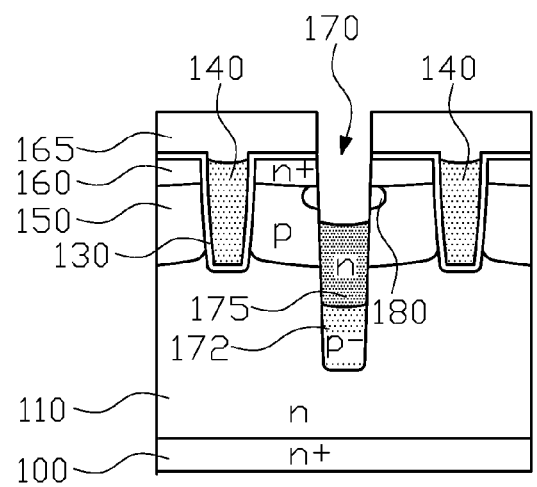
FIGS. 3A and 3B are schematic views showing a fabrication method of a trenched power semiconductor device with enhanced breakdown voltage in accordance with a third embodiment of the present invention.
Figure 3B:
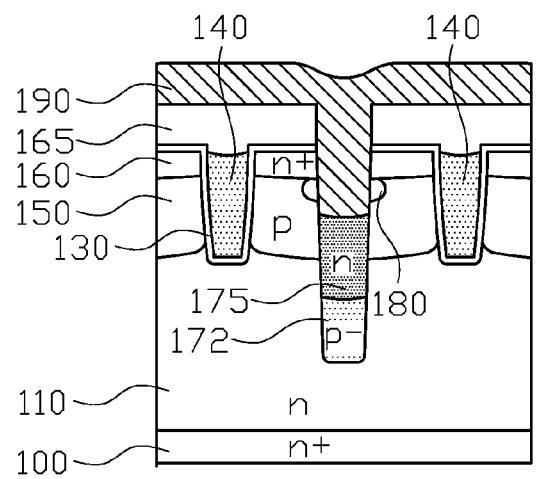

FIGS. 3A and 3B are schematic views showing a fabrication method of a trenched power semiconductor device with enhanced breakdown voltage in accordance with a third exemplary embodiment of the present invention. A major difference between the present embodiment and the first embodiment lies in the formation of the dielectric structure 174. The present embodiment has an n-type third polysilicon structure 175 instead of the dielectric structure 174 formed on the second polysilicon structure 172. As shown in FIG. 3A, which follows the fabrication step of FIG. 1F, after the step of forming the second polysilicon structure 172 in the lower portion of the first trench 170, a n-type third polysilicon structure 175 at least extended upward to the body region 150 is formed above the second polysilicon structure 172. Then, as shown in FIG. 3B, a source metal layer 190 is formed on the patterned layer 165 and fills the first trench 170 to connect to the heavily doped region 180 and the source region 160. The trenched power semiconductor structure provided in the present embodiment has a schottky diode structure formed at the interface between the source metal layer 190 and the n-type third polysilicon structure 175, which is helpful for improving switching speed.

Figure 3C:
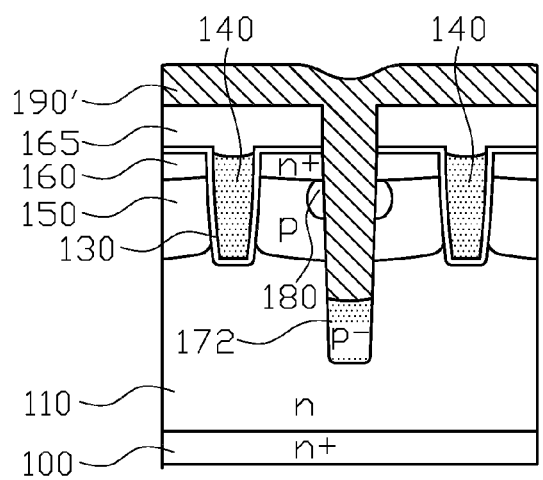
FIG. 3C is a schematic view showing a fabrication method of a trenched power semiconductor device with enhanced breakdown voltage in accordance with a fourth embodiment of the present invention.

FIG. 3C is a schematic view showing a fabrication method of a trenched power semiconductor device with enhanced breakdown voltage in accordance with a fourth exemplary embodiment of the present invention. A major difference between the present embodiment and the first embodiment is that, the present embodiment forms a metal plug in the first trench 170 instead of the dielectric structure 174. As shown, the metal plug is located above the second polysilicon structure 172 and at least extended upward to the body region 150. As a preferred embodiment, the source metal layer 190 may be formed to fill the first trench 170 and the portion filling the first trench 170 may be regarded as the metal plug. Similar to the third embodiment of the present invention, the trenched power semiconductor device of the present embodiment also has a schottky diode structure formed at the interface between the source metal layer 190' and n-type epitaxial layer 110 below the p-type body region 150, which is helpful for improving switching speed.

Figure 4A:
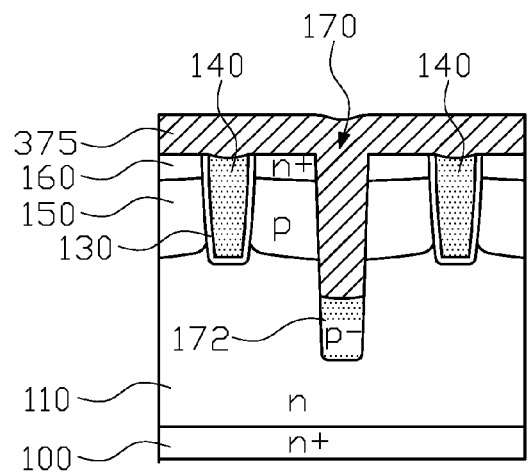
FIGS. 4A to 4C are schematic views showing a fabrication method of a trenched power semiconductor device with enhanced breakdown voltage in accordance with a fifth embodiment of the present invention.
Figure 4B:
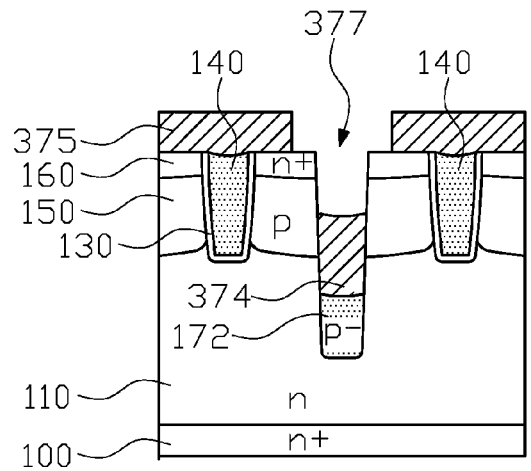
Figure 4C:
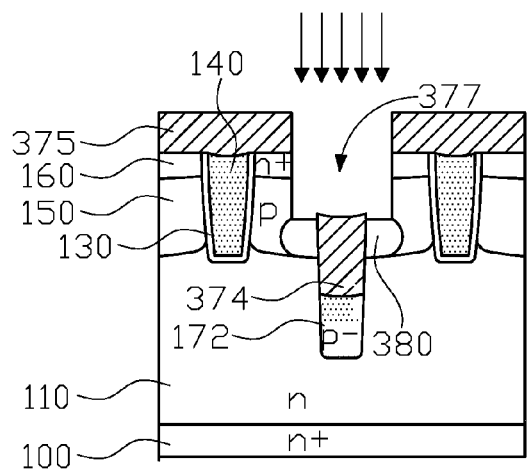

FIGS. 4A to 4C are schematic views showing a fabrication method of the trenched power semiconductor device with enhanced breakdown voltage in accordance with a fifth exemplary embodiment of the present invention. As shown in FIG. 4A, which is next to the fabrication step of FIG. 1D, after the formation of the first trench 170 and the p-type second polysilicon structure 172, the pattern layer 165 on the epitaxial layer 110 is firstly removed. Then, a dielectric layer 375 is conformally formed on the epitaxial layer 110 and fills the first trench 170. Thereafter, as shown in FIG. 4B, an open for defining the source contact window 377 is formed in the dielectric layer 375 by using lithographic and etching steps. The open in the dielectric layer 375 is aligned to the first trench 170 but has a width greater than that of the first trench 170. A portion of the dielectric material in the first trench 170 is also removed in the present etching step so as to leave the dielectric structure 374 in the first trench 170. Next, as shown in FIG. 4C, by using the dielectric layer 375 shielding the first polysilicon structure 140 as the mask, an etching step is carried out to extend the bottom surface of the source contact window 377 downward. Then, an ion implantation step is used to form the p-type heavily doped regions 380 at the bottom of the source contact window 377. The p-type heavily doped regions 380 are located at the opposite sides of the dielectric structure 374 and reaches the bottom surface of the body region 150. The following fabrication steps of the present embodiment are similar to the above mentioned embodiments and thus are not repeated here.

Figure 5A:
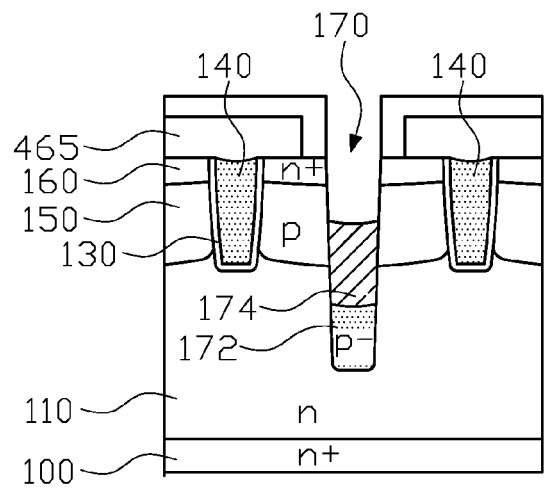
FIGS. 5A and 5B are schematic views showing a fabrication method of a trenched power semiconductor device with enhanced breakdown voltage in accordance with a sixth embodiment of the present invention.
Figure 5B:
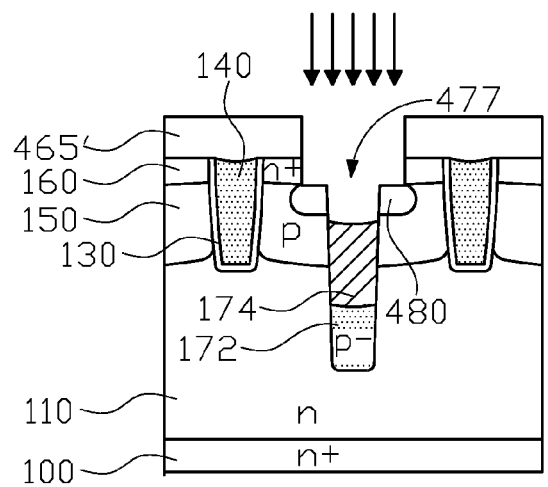

FIGS. 5A and 5B are schematic views showing a fabrication method of a trenched power semiconductor device with enhanced breakdown voltage in accordance with a sixth exemplary embodiment of the present invention. The step disclosed in FIG. 5A is next to the step disclosed in FIG. 1G except that the p-type heavily doped region 480 of the present embodiment is formed after the formation of the first trench 170. As shown in FIG. 5A, after the formation of the dielectric structure 174, an isotropic etching technology is used to remove the pattern layer 465 covering the first polysilicon structure 140 and expand the width of the open in the pattern layer 465. The expanded open can be utilized to define the range of the source contact window 477. Afterward, as shown in FIG. 5B, by using the etched pattern layer 465' as the mask, another etching step is used to extend the bottom surface of the source contact window 477 downward. Then, an ion implantation step is used to form the p-type heavily doped region 480 at the bottom of the source contact window 477.

Figure 6:
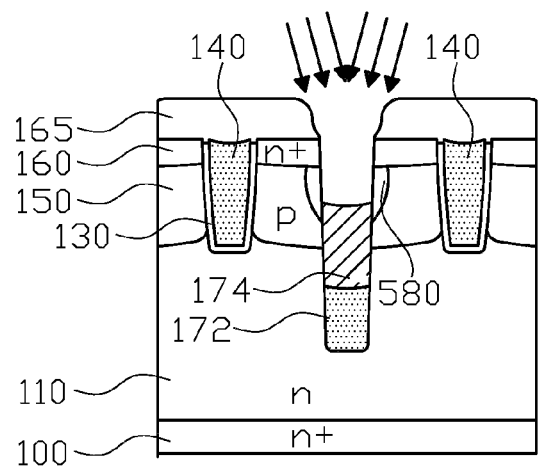
FIG. 6 is a schematic view showing a fabrication method of a trenched power semiconductor device with enhanced breakdown voltage in accordance with a seventh embodiment of the present invention.

FIG. 6 is a schematic view showing a fabrication method of the trenched power semiconductor device with enhanced breakdown voltage in accordance with a seventh exemplary embodiment of the present invention. In contrast with embodiment disclosed in FIG. 5A, in which the ion implantation step for forming the heavily doped region 480 is later than the step of expanding the width of the open in the pattern layer 465 by etching, the present embodiment as shown in FIG. 6 uses the tilted ion implantation step to form the p-type heavily doped region 580 at the opposite sides of the first trench 170 with the pattern layer 465 and the dielectric structure 174 as the implantation mask.

Figure 7A:
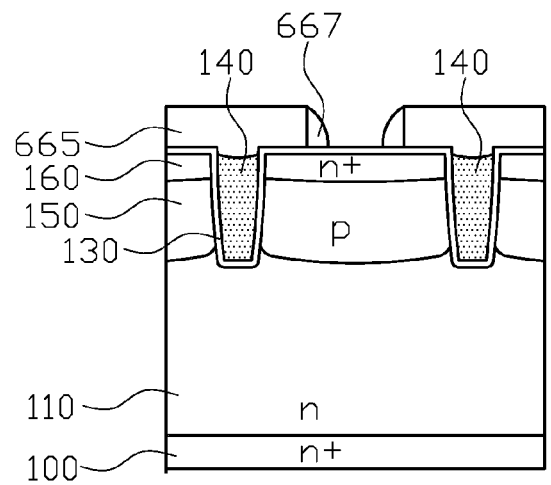
FIGS. 7A and 7B are schematic views showing a fabrication method of a trenched power semiconductor device with enhanced breakdown voltage in accordance with an eighth embodiment of the present invention.
Figure 7B:
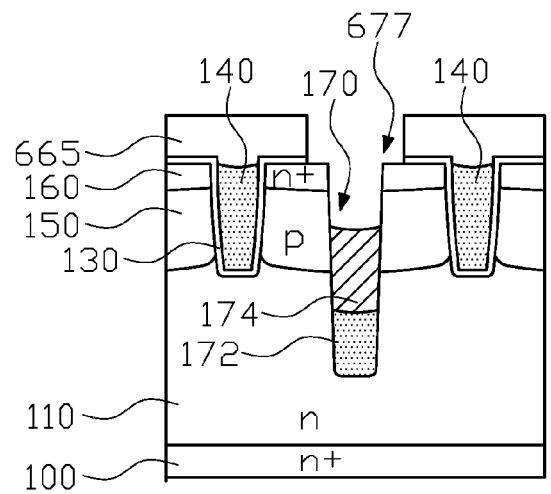

FIGS. 7A and 7B are schematic views showing a fabrication method of a trenched power semiconductor device with enhanced breakdown voltage in accordance with an eighth exemplary embodiment of the present invention. In contrast with the embodiment of FIG. 5A, which defines the first trench 170 by using the open of the pattern layer 465 and adopts the step of expanding the width of the open in the pattern layer 465 for forming the source contact window, the present embodiment has the spacer structure 667 formed on the sidewall of the open in the pattern layer 665 to define the first trench 170 as shown in FIGS. 7A and 7B and removes the spacer structure 667 on the sidewall of the open in the pattern layer 665 right after the formation of the first trench 170 so as to use the original open of the pattern layer 665 to define the location of the source contact window 677.

FIGS. 8A to 8E are schematic views showing a fabrication method of the trenched power semiconductor device with enhanced breakdown voltage in accordance with a ninth exemplary embodiment of the present invention. In contrast with the above mentioned embodiments, in which the gate trench 120 is formed prior to the formation of the first trench 170 between the neighboring gate trenches 120, the present embodiment has the first trench formed prior to the formation of the gate trenches.

Figure 8A:
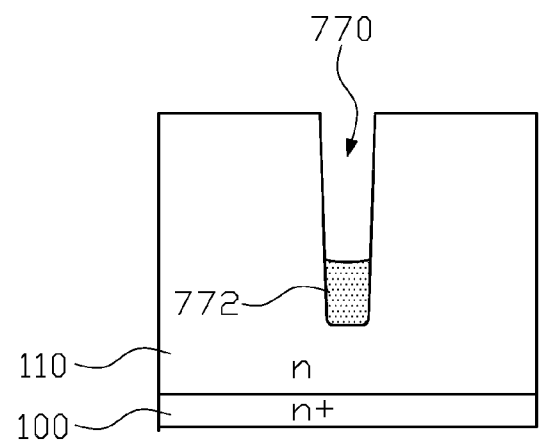
FIGS. 8A to 8E are schematic views showing a fabrication method of a trenched power semiconductor device with enhanced breakdown voltage in accordance with a ninth embodiment of the present invention.
Figure 8B:
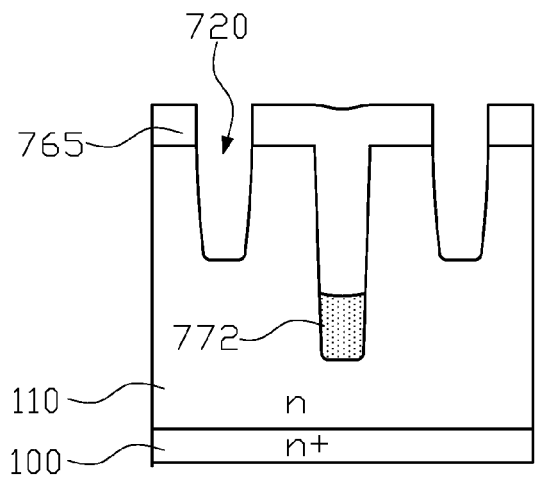

As shown in FIG. 8A, firstly, a first trench 770 is formed in the epitaxial layer 110. Then, a second polysilicon structure 772 is formed in a lower portion of the first trench 770. Afterward, as shown in FIG. 8B, a dielectric pattern layer 765 is deposited over the epitaxial layer 110. The dielectric pattern layer 765 fills the first trench 770 and defines the gate trenches 720 at the both sides of the first trench 770. Thereafter, the epitaxial layer 110 is etched with the dielectric pattern layer 765 as the etching mask so as to form the gate trenches 720.

Figure 8C:
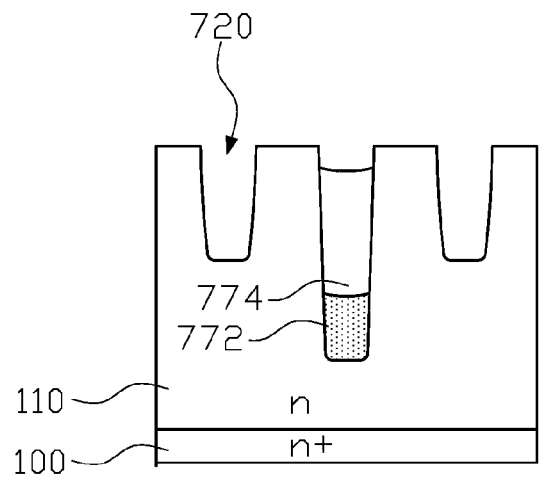
Figure 8D:
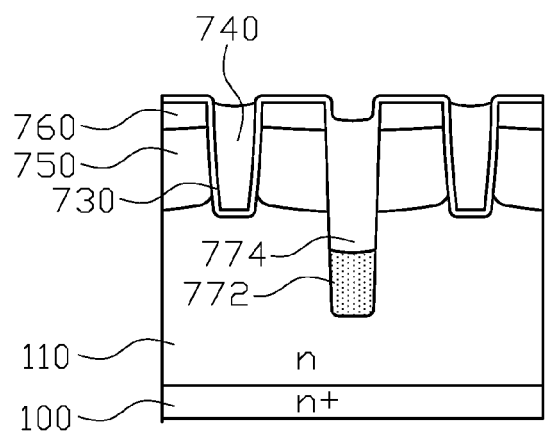

Next, as shown in FIG. 8C, the unwanted portion of the dielectric material is removed by etching to leave the dielectric structure 774 in the first trench 770. Thereafter, as shown in FIG. 8D, the first dielectric layer 730 and the first polysilicon structure 740 are formed in the gate trench 720 in series. Then, the ion implantation steps are used to form the p-type body region 750 and the n-type source region 760 between the neighboring trenches 720,770.

Figure 8E:
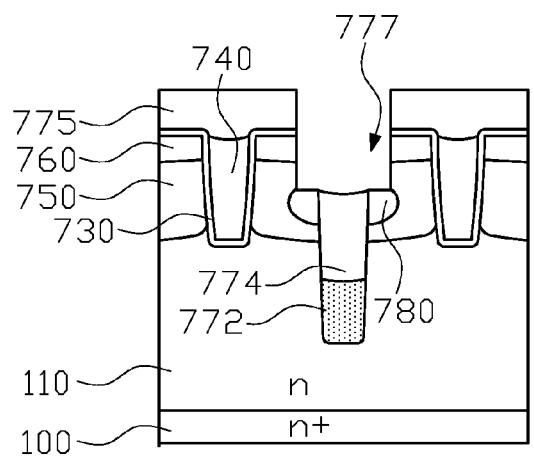

Afterward, as shown in FIG. 8E, an interlayer dielectric layer 775 is formed on the epitaxial layer 110. The interlayer dielectric layer 775 has an open formed therein aligned to the first trench 770 for defining the source contact window 777, and the width of the open is greater than that of the first trench 770. Then, an etching step is carried out to etch the epitaxial layer 110 through the open of the interlayer dielectric layer 775 so as to form the source contact window 777 above the dielectric structure 774. Afterward, an ion implantation step is used to implant p-type dopants into the bottom of the source contact window 777 so as to form the p-type heavily doped regions 780 at the opposite sides of the dielectric structure 774.

Some of the above mentioned embodiments have the p-type heavily doped region extended downward to the bottom surface of the body region 150 to enhance dynamic behavior of power semiconductor devices, but the present invention is not so restricted. According to the demand, the bottom surface of the p-type heavily doped region may be extended to the n-type epitaxial layer below the body region 150 or stayed above the bottom surface of the body region 150.

Moreover, all of the above mentioned embodiments have the second polysilicon structure 172 formed in the lower portion of the first trench 170 for improving breakdown voltage. However, the present invention is not so restricted. The second polysilicon structure 172 may be skipped and the lower portion of the first trench 170 may be filled with the dielectric structure 174 in accordance with an embodiment of the present invention. Even without the second polysilicon structure 172, the dielectric structure 174 extended downward from the bottom surface of the body region 150 is also helpful for improving electric field distribution so as to enhance breakdown voltage.

FIGS. 9A to 9E are schematic views showing a fabrication method of a trenched power semiconductor device with enhanced breakdown voltage in accordance with a tenth exemplary embodiment of the present invention. In contrast with the above mentioned embodiments, which adopt separate etching steps to form the first trench 170 and the gate trench 120 respectively, the present embodiment uses an etching step to form the gate trench 820a and the first trench 820b at the same time. In addition, the gate trench 820a and the first trench 820b have substantially identical depth.

Figure 9A:
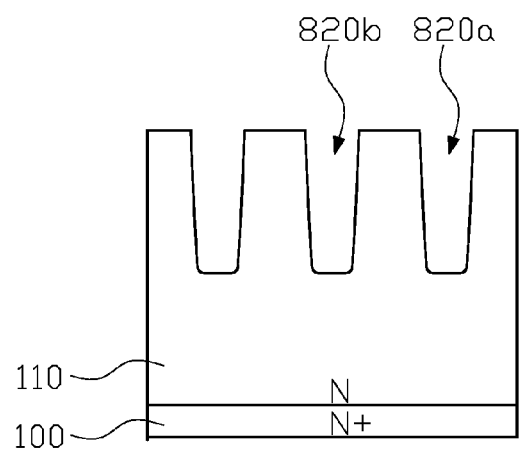
FIGS. 9A to 9F are schematic views showing a fabrication method of a trenched power semiconductor device with enhanced breakdown voltage in accordance with a tenth embodiment of the present invention.
Figure 9B:
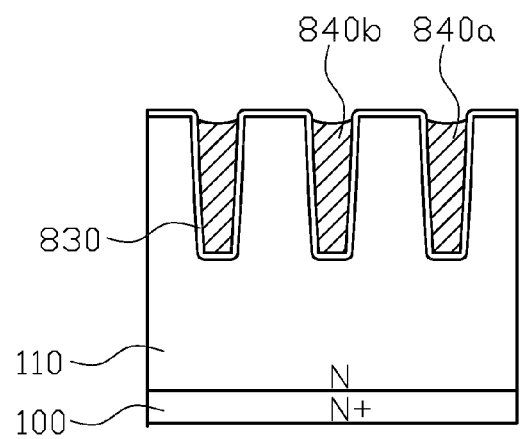
Figure 9C:
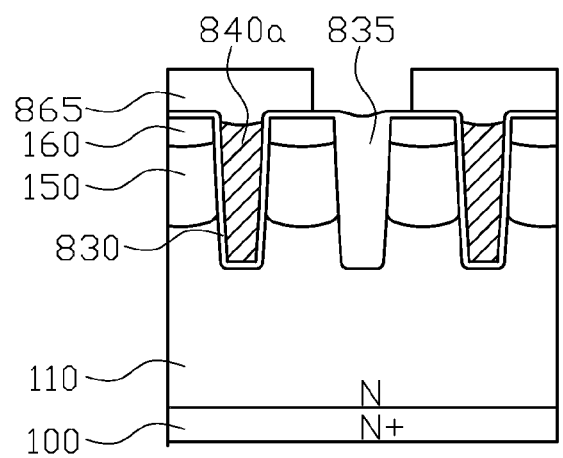

As shown in FIG. 9A, firstly, the gate trench 820a and the first trench 820b are formed in the epitaxial layer 110 by using lithographic and etching steps. Thereafter, as shown in FIG. 9B, a first dielectric layer 830 is formed to line the inner surfaces of the trenches 820a,820b. Then, the first polysilicon structures 840a,840b are formed in the trenches 820a,820b respectively. Afterward, as shown in FIG. 9C, a photo-resist pattern layer 865 is formed to shield the first polysilicon structure 840a in the gate trench 820a. Then, an etching step is carried out to remove the first polysilicon structure 840b in the first trench 820b. Thereafter, remove the photo-resist pattern layer 865 to form a dielectric layer on the first polysilicon structure 840a and the first trench 820b (not shown).

Figure 9D:
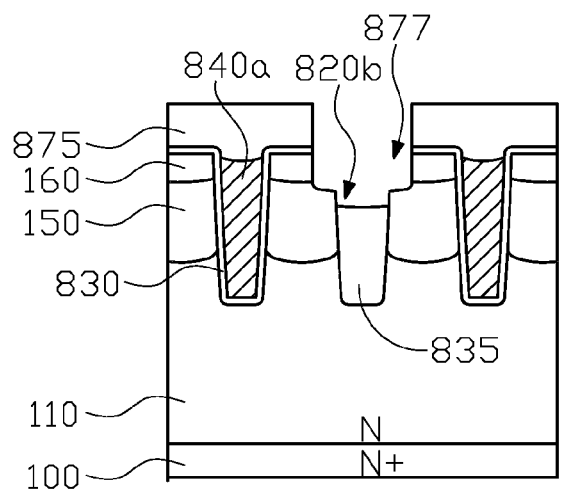
Figure 9E:
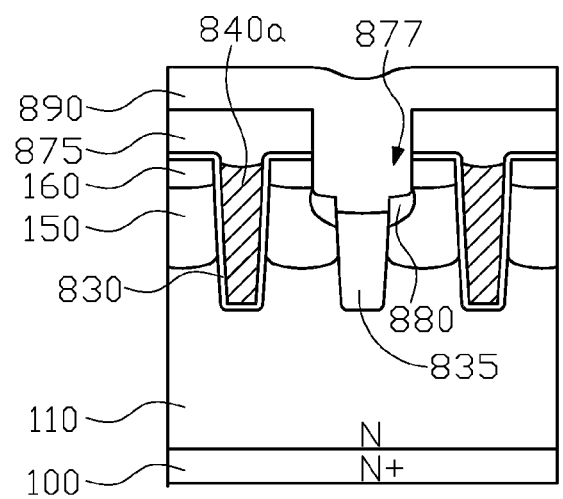

Next, as shown in FIG. 9D, an interlayer dielectric layer 875 is formed to shield the first polysilicon structure 840a in the gate trench 820a and a dielectric structure 835 in the first trench 820b by respectively etching steps. Otherwise, the above-mentioned etching step which forming the interlayer dielectric layer 875 and the dielectric structure 835 may be completed in the same step. Thereafter, an open is formed in the interlayer dielectric layer 875 to define the range of the source contact window 877. The open is substantially aligned to the first trench 820b and has a width greater than that of the first trench 820b. Then, the epitaxial layer 110 is etched through the open in the interlayer dielectric layer 875 to form the source contact window 877. Next, as shown in FIG. 9E, an ion implantation step is used to form the heavily doped region 880 below the source contact window 877. Then, a conductive structure 890, such as a metal layer, is filled into the source contact window 877 to complete the fabrication process.

Figure 9F:
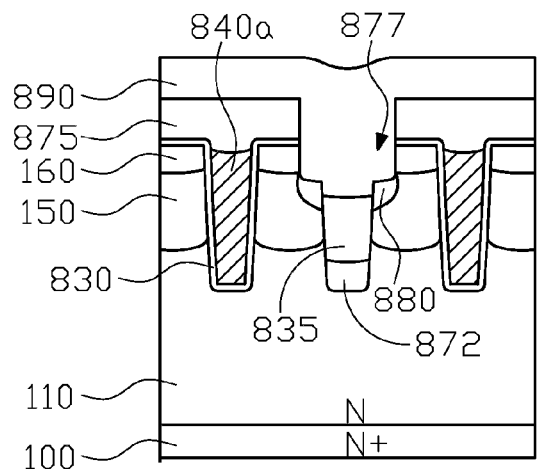

As shown, only the dielectric structure 835 located in the first trench 820b and the second polysilicon structure disclosed in the above mentioned embodiments is skipped. The dielectric structure 835 is also helpful for improving electric field distribution to enhance breakdown voltage. Furthermore, as shown in FIG. 9F, there may be an additional second polysilicon structure 872 formed below the dielectric structure 835 if needed, but the second polysilicon structure 872 should be electrically isolated from the body region 150 with the dielectric structure 835.

Figure 10A:
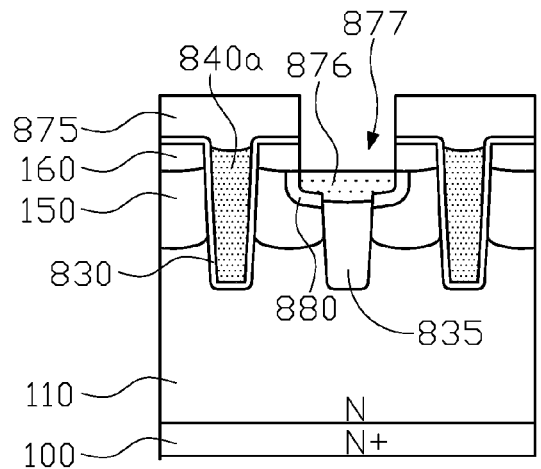
FIGS. 10A to 10C are schematic views showing three different embodiments relative to the formation of the p-type heavily doped region in FIG. 9E.
Figure 10B:
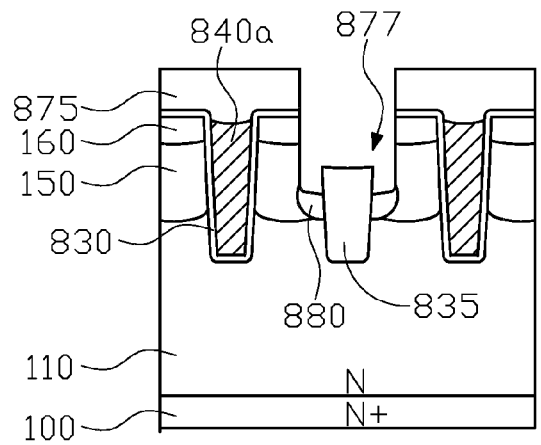
Figure 10C:
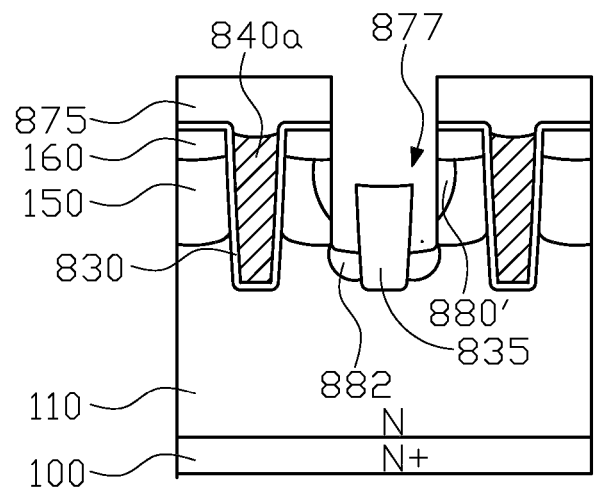

FIGS. 10A, 10B, and 10C show three different embodiments of the fabrication method of the p-type heavily doped region 880 in FIG. 9E. As shown in FIG. 10A, a p-type heavily doped polysilicon structure 876 is firstly formed at the bottom of the source contact window 877, and then a thermal diffusion process is used to form the p-type heavily doped region 880 surrounding the p-type heavily doped polysilicon structure 876. As shown in FIG. 10B, the present embodiment extends the bottom of the source contact window downward to the sidewall of the dielectric structure 835. The resulted structure shows a dielectric structure 835 protruded downward from the bottom surface of the source contact window. Thereafter, an ion implantation step is used to form the p-type heavily doped regions 880 in the body region 150 adjacent to the opposite sides of the dielectric structure 835. It is noted that since the source contact window 877 is deep into the body region 150, the implantation step with large implantation depth is not needed for forming the p-type heavily doped region 880 extended to the bottom surface of the body region 150. In FIG. 10C, the source contact window 877 is deeply extended to the epitaxial layer 110 below the body region 150 such that the n-type epitaxial layer 110 below the body region 150 is exposed. The p-type heavily doped region 880' is formed at the opposite sides of the source contact window 877 by using the tilted ion implantation method. It is noted that since the dielectric structure 835 is protruded upward from the bottom surface of the source contact window 877, the dielectric structure 835 may prohibit the p-type dopants from tilted implanted to the bottom of the source contact window 877. Thereby, after the following source metal deposition step, a schottky diode structure would be formed at the bottom surface of the source contact window 877 to enhance switching speed of the power semiconductor device. In addition, an ion implantation step performed in the normal direction may be added to form the n-type heavily doped region 882 below the source contact window 877 to further reduce resistance crossing the schottky diode.

Figure 11:
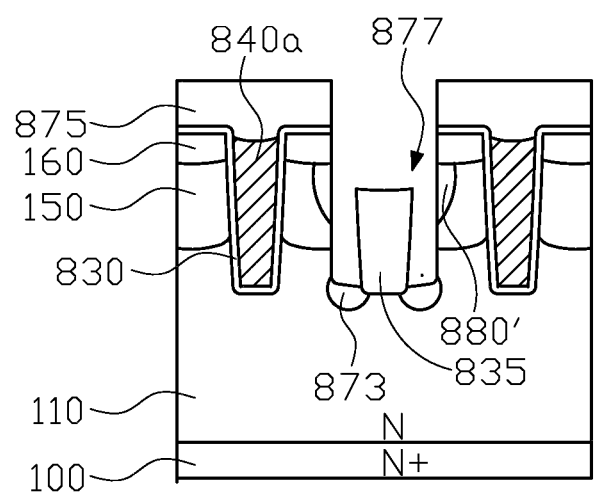
FIG. 11 is a schematic view showing a fabrication method of a trenched power semiconductor device with enhanced breakdown voltage in accordance with an eleventh embodiment of the present invention.

FIG. 11 is a schematic view showing a fabrication method of a trenched power semiconductor device with enhanced breakdown voltage in accordance with an eleventh exemplary embodiment of the present invention. In contrast with the embodiment shown in FIG. 10C, the present embodiment has the source contact window 877 extended deeper such that a portion of the side surface of the source contact window 877 is located below the body region 150. In addition, the present embodiment adopts an ion implantation step to form the p-type doped region 873 at the bottom of the source contact window 877. Thus, after the following source metal depositing step, a schottky diode structure is formed on the side surface of the lower portion of the source contact window 877 to enhance switching speed of the power semiconductor device. Moreover, the p-type doped region (or the p-type polysilicon structure) 873 formed below the source contact window 877 is also helpful for adjusting electric field distribution to enhance breakdown voltage.

Figure 12A:
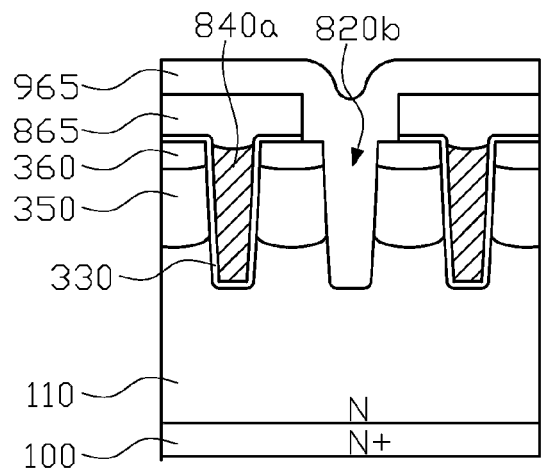
FIGS. 12A to 12C are schematic views showing a fabrication method of a trenched power semiconductor device with enhanced breakdown voltage in accordance with a twelfth embodiment of the present invention.
Figure 12B:
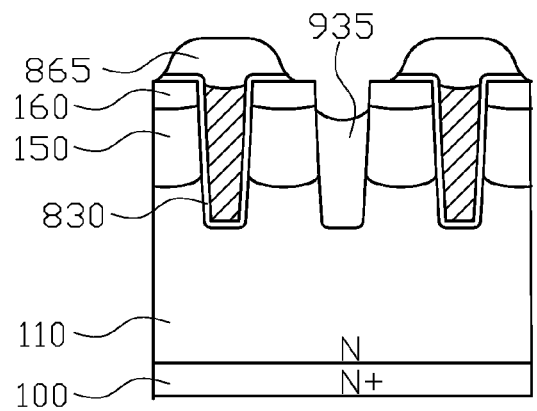
Figure 12C:
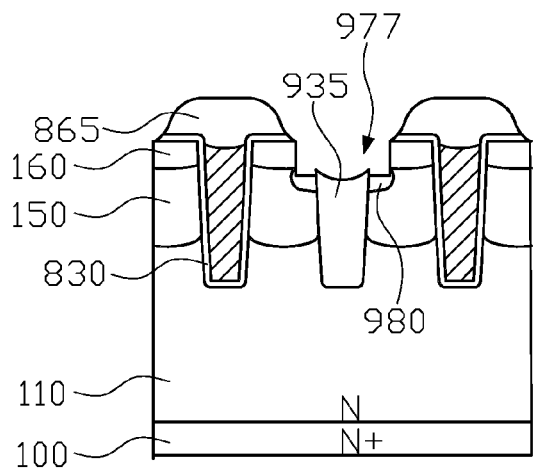

FIGS. 12A to 12C are schematic views showing a fabrication method of a trenched power semiconductor device with enhanced breakdown voltage in accordance with a twelfth exemplary embodiment of the present invention. Different from the embodiment disclosed in FIGS. 9B and 9C, which removes the photo-resist pattern layer 865 right after selectively etching the first polysilicon structure 840b in the first trench 820b, the present embodiment as shown in FIG. 12A uses the typical dielectric material, such as silicon oxide, to form the pattern layer 865. The pattern layer 865 is kept after the first polysilicon structure 840b is removed and a dielectric layer 965 is formed over the pattern layer 865 and fills the first trench 820b.

Thereafter, as shown in FIG. 12B, the unwanted dielectric material is removed to leave the dielectric structure 935 in the first trench 820b. The dielectric layer 965 covering the pattern layer 865 is also removed in this etching step. If the pattern layer 865 is composed of the dielectric material with similar etching characteristics with respect to the dielectric layer 965, a portion of the pattern layer 865 may be also removed in the present etching step so as to show the profile as shown in this figure. Thereafter, as shown in FIG. 12C, the epitaxial layer 110 is etched through the open in the pattern layer 865 to form the source contact window 977. Then, an ion implantation step is used to form the heavily doped region 980 at the bottom of the source contact window 977. Afterward, a conductive structure (not shown), such as a source metal structure, is formed in the source contact window 977 to electrically connect to the heavily doped region 980 and the source region 160 to complete the fabrication process.

Figure 13:
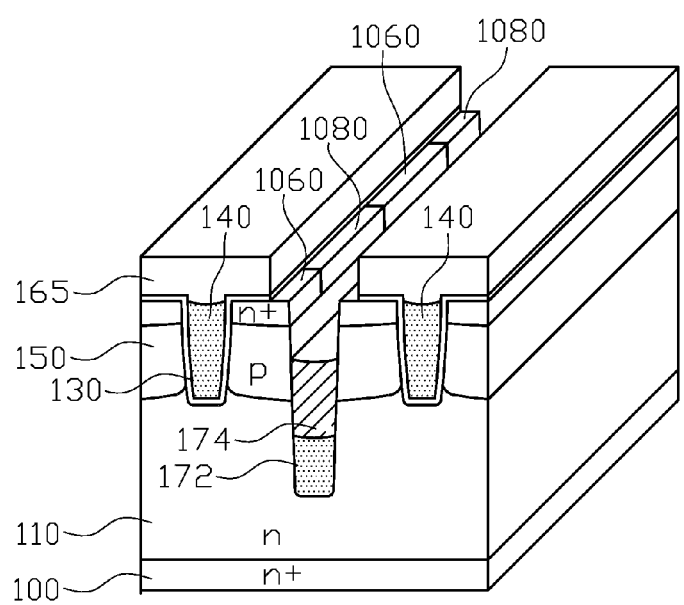
FIG. 13 is a schematic view showing a fabrication method of a trenched power semiconductor device with enhanced breakdown voltage in accordance with a thirteenth embodiment of the present invention.

In the above mentioned embodiments, the p-type heavily doped region is substantially located below the source region. However, the present invention is not so restricted. As shown in FIG. 13, the p-type heavily doped region 1080 and the source region 1060 may be alternatively arrayed in the surface layer of the body region 150. The heavily doped region 1080 and the source region 1060 of the present embodiment may be formed by using two separated lithographic steps to define the location thereof and the following ion implantation steps or even a single lithographic step to define the location of the heavily doped region 1080 or the source region 1060. For example, a blank ion implantation step may be used to implant n-type dopants in the surface layer of the body region 150 first, and then a lithographic step is used to define the location of the heavily doped region. The defined region is then implanted with high concentration p-type dopants such that the conductive type of the defined region is changed to p-type. That is, the implantation areas of the two ion implantation steps are partly overlapped so as to form the heavily doped region 1080 and the source region 1060 alternatively arrayed on the body region. Thereby, the alternative arrayed heavily doped regions and source regions are formed in the surface layer. The above mentioned embodiment adopts the lithographic step to define the location of the heavily doped region and implants n-type dopants before the heavily doped region is defined. However, the present invention is not so restricted. The lithographic step may be used to define the range of the source region and the blank ion implantation step may be used to implant p-type dopants.

As mentioned above, the fabrication method of the trenched power semiconductor device of the present invention is capable to have the first trench self-aligned to the p-type heavily doped region so as to prevent the unwanted influence of aligning errors. In addition, the second polysilicon structure and the dielectric structure formed in the lower portion of the first trench are helpful for adjusting electric field distribution between the gate trenches and the drain electrode so as to enhance breakdown voltage. With the improvement of the breakdown voltage, the heavily doped region formed at the opposite sides of the dielectric structure may be extended deeper than before, for example, to the bottom surface of the body region. Thus, the trenched power semiconductor device of the present invention is helpful for accessing a good balance between dynamic performance and breakdown voltage.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched power semiconductor device with enhanced breakdown voltage at least comprising steps of:
   (a) providing a substrate;
   (b) forming at least two gate trenches in the substrate;
   (c) forming a first dielectric layer lining inner surfaces of the gate trenches;
   (d) forming a first polysilicon structure in the gate trenches;
   (e) forming at least a first trench, wherein the first trench is positioned between the neighboring gate trenches;
   (f) forming a second polysilicon structure of a first conductive type in a lower portion of the first trench, wherein the second polysilicon structure is in contact with the portion of the substrate that is surrounding the first trench;
   (g) after the step of forming the second polysilicon structure of the first conductive type, forming a dielectric structure in the first trench, wherein the dielectric structure at least extends upward to the body region;
   (h) forming a body region of the first conductive type between the gate trenches, wherein the first trench extends to the substrate below the body region, and the second polysilicon structure is spaced from the body region with a predetermined distance;
   (i) forming a source region of a second conductive type in an upper portion of the body region;
   (j) forming an interlayer dielectric layer on the first polysilicon structure to define a source contact window aligned to the first trench;
   (k) forming at least a heavily doped region of the first conductive type in the body region; and
   (l) forming a source metal layer in the source contact window for electrically connecting to the heavily doped region and the source region.

2. The fabrication method of the trenched power semiconductor device with enhanced breakdown voltage of claim 1, wherein the step of forming the dielectric structure comprises:
   forming a dielectric layer covering the interlayer dielectric layer and filling the first trench; and
   removing a portion of the dielectric layer outside the first trench and expanding a width of the source contact window by etching.

3. The fabrication method of the trenched power semiconductor device with enhanced breakdown voltage of claim 1, wherein the steps of the forming the heavily doped region and the source region include two ion implantation steps for implanting dopants of the first conductive type and that of the second conductive type respectively, and implantation areas of the two ion implantation steps are partly overlapped for forming the heavily doped region and the source region alternatively arrayed on the body region.

4. The fabrication method of the trenched power semiconductor device with enhanced breakdown voltage of claim 1, wherein the step of forming the heavily doped region is to implant first conductive type dopants into the body region through the source contact window, and the heavily doped region is extended to the substrate below the body region.

5. The fabrication method of the trenched power semiconductor device with enhanced breakdown voltage of claim 1, wherein the step of forming the heavily doped region includes:
   forming a heavily doped polysilicon structure on the dielectric structure; and
   thermal diffusing dopants in the heavily doped polysilicon structure to the body region for forming the heavily doped region adjacent to the heavily doped polysilicon structure.

6. The fabrication method of the trenched power semiconductor device with enhanced breakdown voltage of claim 1, wherein the step of forming the first trench is later than the step of forming the source region in the upper portion of the body region, and the first trench penetrates the body region.

7. The fabrication method of the trenched power semiconductor device with enhanced breakdown voltage of claim 1, after the step of forming the second polysilicon structure, further comprising a step of forming a third polysilicon structure of the second conductive type in the first trench, and the third polysilicon structure being located above the second polysilicon structure and at least extended upward to the body region.

8. The fabrication method of the trenched power semiconductor device with enhanced breakdown voltage of claim 1, after the step of forming the second polysilicon structure of the first conductive type, further comprising a step of filling a metal plug in the first trench, and the metal plug being located above the second polysilicon structure and at least extended upward to the body region.

9. A fabrication method of a trenched power semiconductor device with enhanced breakdown voltage at least comprising steps of:
providing a substrate;
forming at least a first trench in the substrate;
forming a second polysilicon structure of a first conductive type in a lower portion of the first trench, wherein the second polysilicon structure is in contact with the portion of the substrate that is surrounding the first trench;
disposing a first dielectric layer over the second polysilicon structure and the substrate;
forming at least two gate trenches respectively in the portions of the substrate positioned at two sides of the first trench;
removing a portion of the first dielectric layer;
forming a second dielectric layer lining inner surfaces of the gate trenches;
forming a first polysilicon structure in the gate trenches;
forming a body region of the first conductive type in the substrate;
forming a source region of a second conductive type in an upper portion of the body region, wherein the step of forming the body region of the first conductive type and the step of forming the source region of the second conductive type are prior to the step of forming the first trench; and
forming at least a heavily doped region of the first conductive type in the body region, wherein the body region is positioned between the gate trenches, the first trench extends to the substrate below the body region, and the second polysilicon structure is spaced from the body region with a predetermined distance.

10. The fabrication method of the trenched power semiconductor device with enhanced breakdown voltage of claim 9, wherein the step of removing a portion of the first dielectric layer comprises a step of: removing a portion of the first dielectric layer to leave a dielectric structure in the first trench.

11. The fabrication method of the trenched power semiconductor device with enhanced breakdown voltage of claim 9, wherein the step of removing a portion of the first dielectric layer comprises a step of: removing a portion of the first dielectric layer that is filled in the first trench; and the fabrication method of the trenched power semiconductor device with enhanced breakdown voltage further comprises a step of: forming a third polysilicon structure of the second conductive type in the first trench, wherein the third polysilicon structure is positioned on the second polysilicon structure and extends upward to the body region.

12. The fabrication method of the trenched power semiconductor device with enhanced breakdown voltage of claim 9, wherein the step of removing a portion of the first dielectric layer comprises a step of: removing a portion of the first dielectric layer that is filled in the first trench; and the fabrication method of the trenched power semiconductor device with enhanced breakdown voltage further comprises a step of: forming a metal plug in the first trench, wherein the metal plug is positioned on the second polysilicon structure and extends upward to the body region.

13. A fabrication method of a trenched power semiconductor device with enhanced breakdown voltage at least comprising steps of:
providing a substrate;
simultaneously forming at least a first trench and at least two gate trenches in the substrate, wherein the at least two gate trenches are respectively positioned in the portions of the substrate at two sides of the first trench;
forming a first dielectric layer lining inner surfaces of the first trench and the gate trenches;
forming a first polysilicon structure in the first trench and the gate trenches;
forming a body region of a first conductive type in the substrate;
forming a source region of a second conductive type in an upper portion of the body region;
removing the first polysilicon structure in the first trench;
after the step of removing the first polysilicon structure in the first trench, forming a second polysilicon structure in the first trench, wherein the second polysilicon structure is in contact with the portion of the substrate that is surrounding the first trench;
filling a dielectric structure in the first trench;
forming an interlayer dielectric layer to shield the first polysilicon structure in the gate trenches, wherein the interlayer dielectric layer has an open aligned to the first trench, and the open has a width greater than that of the first trench;
forming a source contact window, wherein the open of the interlayer dielectric layer defines the range of the source contact window;
forming at least a heavily doped region below the source contact window; and
forming a metal layer filled into the source contact window.

14. The fabrication method of the trenched power semiconductor device with enhanced breakdown voltage of claim 13, after the step of forming the source contact window and before the step of forming the heavily doped region, further comprising a step of: forming a heavily doped polysilicon structure at the bottom of the source contact window, wherein the heavily doped region is formed surrounding the heavily doped polysilicon structure.

15. The fabrication method of the trenched power semiconductor device with enhanced breakdown voltage of claim 13, wherein the dielectric structure is protruded upward from the bottom surface of the source contact window, and the step of forming the heavily doped region below the source contact window comprises a step of: forming the heavily doped region in the body region adjacent to the opposite sides of the dielectric structure.

16. The fabrication method of the trenched power semiconductor device with enhanced breakdown voltage of claim 13, wherein the source contact window is extended to a portion of the substrate below the body region such that the portion of the substrate below the body region is exposed, and the step of forming the heavily doped region below the source contact window comprises a step of: forming the heavily doped region at the opposite sides of the source contact window.

* * * * *